United States Patent [19]

Stösel

[11] Patent Number: 4,607,218

[45] Date of Patent: Aug. 19, 1986

[54] DIGITAL PHASE MEASUREMENT METHOD

[75] Inventor: Hans R. Stösel, Rebstein, Switzerland

[73] Assignee: Wild Heerbrugg AG, Heerbrugg, Switzerland

[21] Appl. No.: 584,770

[22] Filed: Feb. 29, 1984

[30] Foreign Application Priority Data

Mar. 3, 1983 [CH] Switzerland ............... 1168/83

[51] Int. Cl.⁴ ................................ G01R 25/00
[52] U.S. Cl. ................................ 324/83 D; 324/83 R
[58] Field of Search ............ 324/83 R, 83 A, 83 D, 324/83 Q, 85; 328/133, 134, 136, 155

[56] References Cited

U.S. PATENT DOCUMENTS

| | | | |
|---|---|---|---|
| 3,286,176 | 11/1966 | Birnboim | 324/83 D |
| 3,512,085 | 5/1970 | Peterson | 324/83 D |
| 3,553,596 | 1/1971 | Thompson | 324/83 A |
| 3,579,104 | 5/1971 | Pignard | 324/83 D |
| 3,820,022 | 6/1974 | Watt | 324/83 D |
| 4,215,308 | 7/1980 | Kusters | 324/83 D |
| 4,419,624 | 12/1983 | Brown | 324/83 A |

*Primary Examiner*—Michael J. Tokar
*Attorney, Agent, or Firm*—Roylance, Abrams, Berdo & Goodman

[57] ABSTRACT

In a method for the mathematical, digital measurement of the phase difference of two periodic or cyclic signals U and V of the same frequency by averaging from n elementary measurements Mi, a timing signal of a much higher frequency and asynchronous with signals U and V is counted between directly succeeding zero pasages of signals U and V in the same direction. An elementary calibration Ci is performed in each cycle of U, in which an elementary measurement Mi is performed by counting the timing signals during the complete cycle of U. An overall phase difference is determined, in that the mean value of all the elementary measurements Mi is divided by a mean value of all the elementary calibrations Ci and is multiplied by the cycle.

5 Claims, 6 Drawing Figures

DIGITAL PHASE MEASUREMENT METHOD

BACKGROUND OF THE INVENTION

The invention relates to a method of measuring the phase difference of two periodic signals of the same frequency.

The phase difference F between two signals U and V of the same frequency is often measured by counting the cycles of a timing signal of a much higher frequency between successive zero passages of signals U and V. There is normally a synchronicity relationship between the frequencies of the timing signals t and signals U and V, so that in each full cycle of e.g. U, there is a constant, known number of timing pulses. This synchronicity is generally produced by means of phase-locked loops (PLL).

If, as a result of noise or random phase jitter, a single phase measurement does not provide the necessary accuracy, averaging takes place over several elementary measurements in successive, but not necessarily immediately successive cycles P of U. As the value for the phase difference F is unambiguous only in the range $0 \leq F < P$, such averaging may provide erroneous results when F lies near a boundary of said range. This problem is usually referred to as $2\pi$ ambiguity.

Already known means to remove this uncertainty require considerable circuit expenditure, particularly with regard to analog circuits.

The PLL is in part an analog assembly. If its frequency, which corresponds to a clock frequency, is modulated with the signal frequency U or V, systematic non-linearities may occur in the phase measurement. These non-linearities do not disappear when the measurement is averaged over several elementary measurements. Filtering may remove the non-linearities. However, the filter forming part of the PLL must be a low-pass filter with a very low limit frequency, so that the PLL is slow. It is therefore difficult in many cases to find a satisfactory compromise between linearity and control rate.

The aim of the present invention is to improve the measuring method by reducing to a minimum the constructional expenditure necessary for performing the method, particularly with regard to costly analog circuits.

As a result of the present invention, the aforementioned difficulties in measurement are obviated by using an asynchronously operating clock generator, such as a crystal oscillator.

SUMMARY OF THE INVENTION

There has been provided a method for measuring the phase difference of two periodic signals of the same frequency by averaging counts of a timing signal of a much higher frequency between directly following zero passages of the two signals in the same direction. The timing signal and the two signals are not in synchronicity relationship, and in each cycle of one of the signals in which an elementary measurement is performed, an elementary calibration is performed, which consists of counting the timing cycles during a complete cycle of said signal. "Zero Passage" refers to the change of state of the signals, as is well known, see the vertical line segments on the curves of FIG. 2.

BRIEF DESCRIPTION OF THE DRAWINGS

Embodiments of the invention are described hereinafter relative to the following drawings wherein.

DETAILED DESCRIPTION OF THE INVENTION

Figure 1:
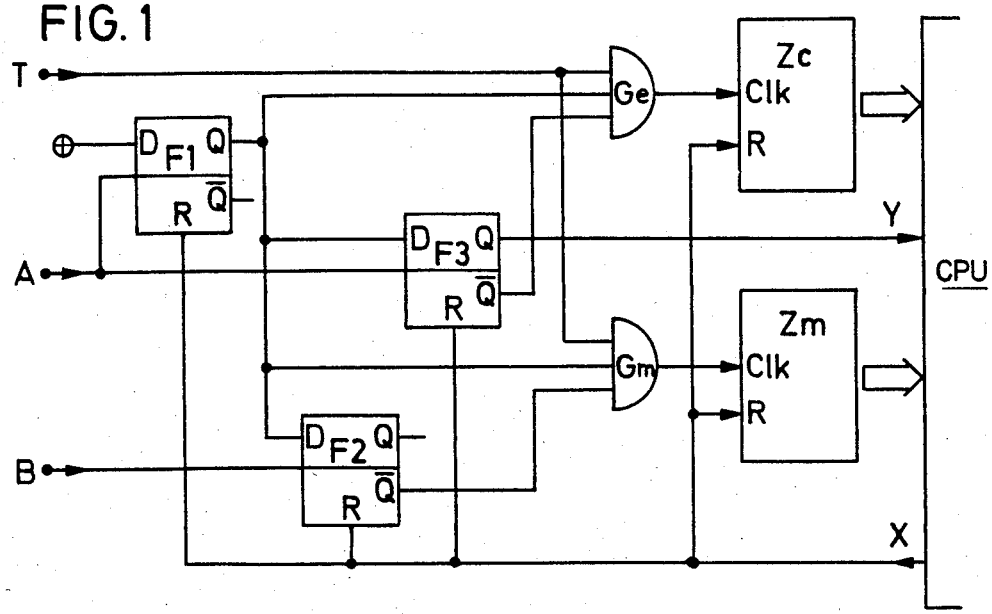
FIG. 1 is a schematic circuit diagram of an exemplary phasemeter useful in the method of the present invention.

In each signal cycle P, in which an elementary measurement Mi is performed, it is necessary to carry out an elementary calibration Ci, in which the timing pulses are counted during the complete signal cycle P. The method hereafter called individual calibration comprises dividing the elementary measurement Mi by the elementary calibration Ci, to obtain the calibrated elementary measurement. A computer, preferably a microprocessor, is used for determining these values.

In practice, at higher measurement frequencies the calculating speed of the microprocessor may not be sufficient to carry out a division in the time available for an elementary measurement Mi. However, if the ratio of the signal frequency U or V to the timing signal frequency is sufficiently stable, then according to the invention the elementary measurements and the elementary calibrations can be separately added up or averaged. Thus, division only takes place once at the end of the overall measurement. This method is hereafter called overall calibration, in distinction from the above cited individual calibration. Indeed this does not falsify the elementary measurements, but merely influences their weighing during averaging.

In the case of individual calibration, a phase difference F is obtained as a mean value of elementary phase differences Fi over n individual measurements:

$$F = \frac{1}{n} \sum_{i=1}^{n} Fi = \frac{P}{n} \sum_{i=1}^{n} Mi/Ci \quad (1)$$

in which:

Mi = measurement counts
Ci = calibration counts
P = scale factor or full cycle

The overall calibration gives the mean an average result G:

$$G = P \cdot \sum_{i=1}^{n} Mi / \sum_{i=1}^{n} Ci \quad (2)$$

On introducing the following abbreviated notation:

$$\Sigma = \sum_{i=1}^{n} \text{ and } x = \overline{xi} = \frac{1}{n} \Sigma xi$$

and on expressing the elementary counts by the standardized deviations from the mean value of:

$$mi = \frac{Mi - M}{C} \text{ and } ci = \frac{Ci - C}{C} \quad (3)$$

then we obtain from (2)

$$G = P \cdot \frac{M}{C} \quad (4)$$

and from (1)

$$F = \frac{1}{n} \Sigma \frac{P \cdot Mi + G}{ci + 1} \quad (5)$$

The quotient is now developed in a series:

$$\frac{1}{ci + 1} = \sum_{J=4}^{\infty} (-ci)^j = 1 - ci + ci^2 \ldots$$

Breaking the series after the second power of deviations and considering that mean values of deviations disappear by definition, we obtain:

$$F = \frac{1}{n} \Sigma (P \cdot mi + G) \cdot (1 - ci + ci^2) \quad (6)$$

$$= G(1 + \overline{ci^2}) - P \cdot \overline{mici}$$

$$= G(1 + A) - B$$

Thus, in the case of overall calibration, an error A proportional to the phase difference P is made, together with an error B independent thereof.

A is approximately the standard deviation $S_e$ of the elementary calibrations in the square. B is the correlation of the measurement and the calibration. In the case of pessimal correlation (proportionality between Mi and Ci) B would approximately be the product of the standard deviations of the measurement Sq and the calibrations Se.

It is to be expected that the standard deviation Sq of the overall measurement obtained by the mean value M over n elementary measurements Mi is smaller by a factor $\sqrt{n}$ than the standard deviation Se of the elementary measurement Mi. Overall calibration is permissable, as long as the error produced by it remains much smaller than Sq, i.e. as long as $$S_e^2 < Sq = Se/\sqrt{n} \text{ or } n \cdot S_e^2 < 1$$

This condition is satisifed in most cases occuring in practice.

FIG. 1 shows a circuit diagram of the phasemeter which, apart from the microprocessor CPU with the necessary port expanders, comprises three flipflops F1, F2, F3, two gates Gm, Ge, and two counters Zm, Zc. The signals U and V are supposed to be supplied to the inputs A and B respectively. Flipflops F2 and F3 are follow-up flipflops of F1, i.e. they can only be set when F1 has first been set. F1 and F3 are triggered by the e.g. positive slope of the signal U. Flip-flop F2 is triggered by the corresponding slope of V.

Figure 2:
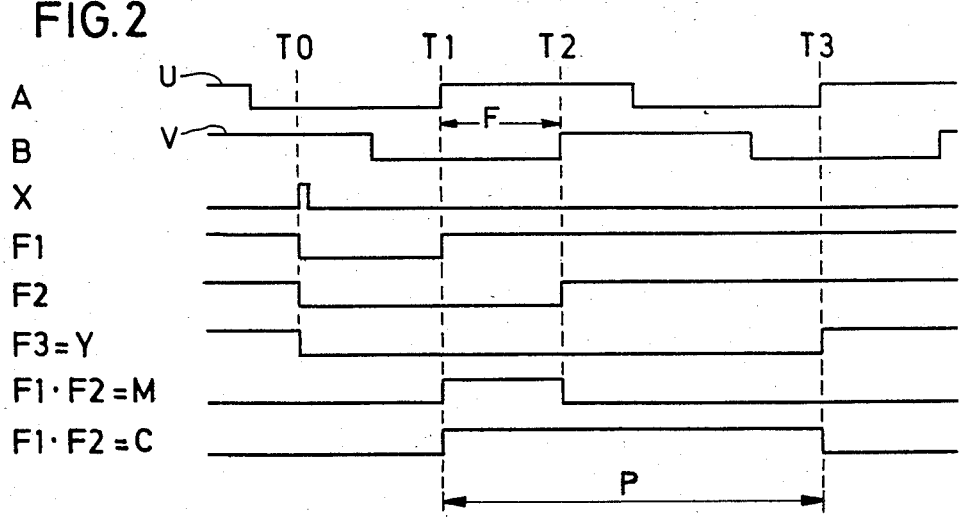
FIG. 2 is a timing chart or chronogram of an elementary measurement.

FIG. 2 is a chronogram of an elementary measurement and associated signals. A reset pulse X emitted at time TO by the micrprocessor CPU starts an elementary measurement Mi, by resetting all flipflops and counters. The first switching slope of U following the reset pulse X sets flipflop F1 at time T1, so that both gates Gc and Gm are opened and timing pulses are supplied to the counters Zc and Zm. The next switching slope of U and the set output Q of flipflop F1 sets flipflop F3 at time T3, so that the gate Gc responsive to the reset output $\overline{Q}$ of F3, is closed and the calibration count by counter Zc is ended. At a time T2, between T1 and T3, there is a switching edge of V at input B which along with the set output Q of F1 sets flipflop F2. Gate Gm, responsive to the reset output of F2 is closed and the measurement count of counter Zm is ended.

The state of F3 is supplied to the microprocessor CPU as a ready-signal Y and informs the latter that the elementary measurement Mi is ended and that there are valid values in the counters. Y forms with X a so-called handshake system.

Figure 3:
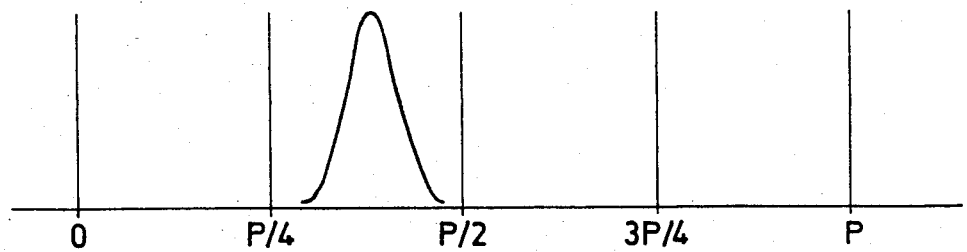
FIGS. 3 to 6 illustrate the spread or scatter of an elementary measurement in the form of a normal distribution, as well as the $2\pi$ ambiguity to be taken into consideration during the elementary measurements.
Figure 4:
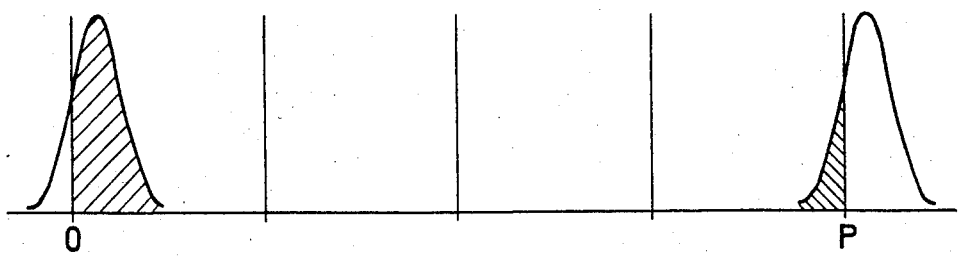

The elementary measurements Mi read in this way are still subject to $2\pi$ ambiguity. They are spread around a mean value, e.g. in the form of a normal distribution according to FIG. 3. As the phase difference F is measured modulo P (P=cycle), the distribution curve may be cut into two remote parts according to FIG. 4, when F is close to O or P. The mean of switch values is of course not in the maximum of the distribution curve and is consequently incorrect.

The choice of means for correcting this error depends inter alia on the width of the spread or scatter of the elementary measurements. If they are distributed over the entire cycle, a sensible averaging is not possible. Thus, it must be presumed that within the cycle there is an interval, in which the density of elementary measurements is negligible. If this requirement is met with an adequate confidence, it may be made more stringent by requiring that said empty interval has a certain size, e.g. 2P/3 or 3P/4. This requirement, which is easily fulfilled in most cases, greatly simplifies the elimination of the $2\pi$ ambiguity.

If the cycle P is subdivded into three of four equally large intervals, it can be expected that, at most one interval limit will intersect the distribution curve of the elementary measurements. Averaging errors occur, if this interval limit is the cycle boundary O or P.

Figure 5:
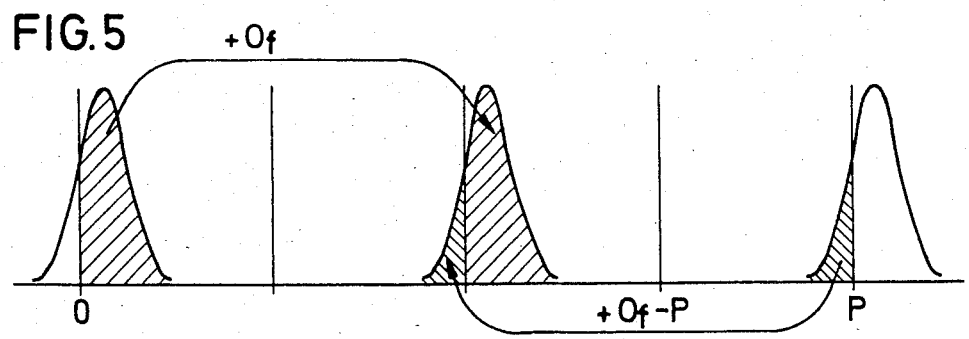

Usually, on the basis of one or more sample elementary measurements, an offset $O_f$ is determined which is then added to modulo P for to all following elementary measurements, shifting them to the vicinity of the cycle center according to FIG. 5. In this way, a distribution is obtained, which is no longer split into two parts by the cycle boundary O or P and consequently there is a sensible mean value. Subsequently, this mean value is moved back again by the offset $O_f$.

Various methods are known to apply the offset to the elementary measurements. This is generally carried out in circuitry by manipulating the input signals U and V, e.g. by the choice of favorably positioned slopes or by inverting a signal. Also, correction may be made at the time the signals U and V are generated (e.g. by generating more than two signals amongst which a favorably pair may be selected). In all solutions with offset, the cycle P must be accurately known prior to the measurements because the offset must be added modulo P of the elementary measurements. This requirement is not always met e.g. in the case of an asynchronous timing signal and overall calibration.

However, the method of the present invention does not require any manipulation of the input signals, which leads to circuitry economies. Also there is no correction of the elementary measurements, e.g. addition of an offset. The elementary measurements are summed in the way they are obtained, i.e. with their ambiguity. This sum is only corrected at the end of the overall measurement. Consequently, there is no need to accurately know the value P when carrying out the elementary measurements.

Initially, two margin intervals of the cycle are arbitrarily defined by means of two bounds $a$ and $b = C' - a$, $a$ being approximately $\frac{1}{4}$ to $\frac{1}{3}$ of the roughly known or anticipated value $C'$ of the calibration counts. The sum of Mi is incorrect if both arbitrary margin intervals contain measurements, i.e. if the distribution of the measurements is intersected by the cycle boundary. This leads to the following rule for correction:

If there are measurements in the upper margin interval (Mi>b), then all measurements in the lower margin interval (Mi<a) must be increased by Ci.

While carrying out the elementary measurements, it is not at that time known, whether correction will have to be applied. Therefore, those calibrations Ci, whose Mi<a, are separately added together in a sum Ca.

Thus, during the measurement, three sums are formed:

$M = \Sigma Mi$ = the sum of all elementary measurements to be averaged.

$Ca = \Sigma Ci(Mi<a)$ = the sum of all calibrations, whose measurements are in the low margin interval.

$C = \Sigma Ci(Mi \geq a)$ = the sum of all other calibrations.

In addition a flag Q is set whenever a measurement Mi>b appears:

Q=1 or true: if at least one Mi>b has been detected
Q=0 or false: else

After having performed all measurements, the following operations are carried out:

$C = C + Ca$.

If Q is true then:

$M = M + Ca$.

Figure 6:
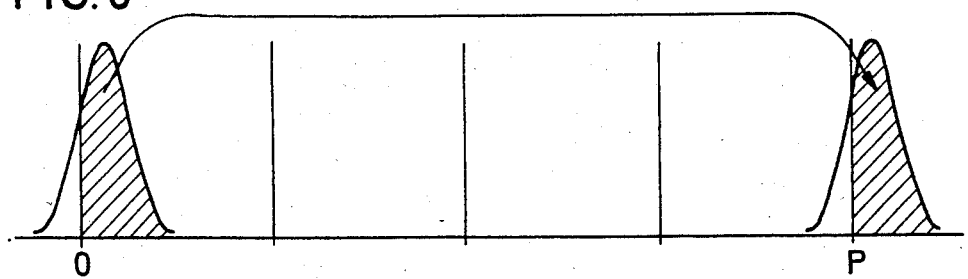

FIG. 6 illustrates this operation.

The overall phase difference G is determined by the relation:

$$G = \left[ P \frac{M + Q \cdot Ca}{n \cdot C} \right] \text{Mod } P = P \cdot \text{Int} \left[ \frac{M + Q \cdot Ca}{n \cdot C} \right]$$

Where
Q=1 add Mi>b.
and Q=0 otherwise.

What is claimed is:

1. A method for digital measurement of the phase difference (F) between two cyclic and periodic signals (U,V) having the same frequency comprising the steps of;
   providing a timing signal (T) having a frequency much higher than the frequency of either of said signals (U,V);
   counting the cycles of said timing signal (T) in an internal corresponding to said phase difference (F) by starting to count said timing signal cycles at a zero passage (T1) of one (U) of said two signals (U,V) in a predetermined direction and ending said counting upon the next succeeding zero passage (T2) of the other of said two signals (V) in the same said predetermined direction;
   using the number of said counted cycles in said phase difference interval to produce a first signal (Mi);
   counting the cycles of said timing signal (T) in an interval corresponding to the period (P) if one of said signals (U) by starting to count said timing signal cycles at a zero passage (T1) of one (U) of said two signals in a predetermined direction and ending said counting upon the next succeeding zero passage (T3) of said same one (U) of said two signals (U,V) in said same predetermined direction;
   producing a calibration signal (Ci) using the number of said counted cycles in said period interval;
   averaging a number (n) of said first signals (Mi); and
   determining said phase difference (F) using said number (n) of said first signals (Mi) and said calibration signal (Ci).

2. A method according to claim 1, and the steps of forming respective mean values (M, C) from said first signal (Mi) and said calibration signal (Ci), and utilizing said mean values (M, C) in said step of determining said phase difference.

3. A method according to claim 1, wherein said timing signal is asynchronous with respect to said two signals.

4. A method according to claim 1 further comprising the steps of determining a mean value M of all said first signals (Mi) according to the following relationship:

$$M = \frac{1}{n} \sum_{i=1}^{n} Mi$$

and determining a mean value C of all the calibrations signals (Ci) according to the following relationship:

$$C = \frac{1}{n} \sum_{i=1}^{n} Ci$$

and approximating the mean phase difference by the value G obtained according to the relation:

$$G = P \frac{M}{C}$$

wherein P is a scale factor representing the full cycle, thus having the value of $2\pi$ if G is to be indicated in radians.

5. A method according to claim 2, comprising the steps of: removing any $2\pi$ ambiguity between the signals U and V by defining two bounds $a$ and $b = C' - a$, $a$ being approximately $\frac{1}{4}$ to $\frac{1}{3}$ of an estimated value $C'$ of the calibration signal; separately summing those calibration signals (Ci) for which Mi<a to a sum Ca; setting a flag Q whenever a measurement Mi>b is obtained; and determining the overall phase difference G in accordance with the equation:

$$G = \left[ P \Sigma \frac{M + Q \cdot Ca}{n \cdot C} \right] \text{od } P = P \cdot \text{Int} \left[ \Sigma \frac{M + Q \cdot Ca}{n \cdot C} \right]$$

wherein
Q=1 if any Mi>b have occurred
Q=0 else.

* * * * *